(12) United States Patent
Hung

(10) Patent No.: US 6,864,588 B2
(45) Date of Patent: Mar. 8, 2005

(54) MCM PACKAGE WITH BRIDGE CONNECTION

(75) Inventor: Chih-Pin Hung, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 10/657,231

(22) Filed: Sep. 9, 2003

(65) Prior Publication Data

US 2004/0135250 A1 Jul. 15, 2004

(30) Foreign Application Priority Data

Jan. 14, 2003 (TW) ........................................ 92100739 A

(51) Int. Cl.[7] .............................................. H01L 23/48
(52) U.S. Cl. ...................... 257/787; 257/723; 257/781; 257/782; 257/784
(58) Field of Search ................................ 257/787, 781, 257/782, 784, 723

(56) References Cited

U.S. PATENT DOCUMENTS

| | | | | |
|---|---|---|---|---|
| 4,972,250 A | * | 11/1990 | Omori et al. ............... | 257/631 |
| 5,198,385 A | * | 3/1993 | Devitt et al. ................ | 438/233 |
| 6,410,983 B1 | * | 6/2002 | Moriizumi et al. ......... | 257/723 |
| 6,521,994 B1 | * | 2/2003 | Huse et al. ................. | 257/724 |

* cited by examiner

Primary Examiner—Jasmine Clark
(74) Attorney, Agent, or Firm—Bacon & Thomas PLLC

(57) ABSTRACT

An MCM package with bridge connection mainly comprises a carrier, a first chip, a second chip and at least one conductive body. The carrier has an upper surface and an opposite lower surface, and a plurality of contacts formed on the upper surface of the carrier. The first chip has a first active surface, a first side surface and a first boding pad formed on the first active surface. Similarly, the second chip has a second active surface, a second side surface, and a second boding pad formed on the second active surface. Therein, the first side surface of the first chip is proximate to the second side surface of the second chip, and the first active surface is coplanar to the second active chip. Accordingly, one of the conductive body can be disposed continuously on the active surface and the second surface to electrically connect the first chip and the second chip.

28 Claims, 5 Drawing Sheets

MCM PACKAGE WITH BRIDGE CONNECTION

BACKGROUND OF THE INVENTION

1. Field of Invention

This invention relates to an MCM (Multi-chips Module) package. More particularly, the present invention is related to an MCM package with bridge connection.

2. Related Art

Integrated circuit (chip) packaging technology is becoming a limiting factor for the development in packaged integrated circuits of higher performance. Semiconductor package designers are struggling to keep pace with the increase in pin count, size limitations, low profile, and other evolving requirements for packaging and mounting integrated circuits.

Originally, the electrical connection between the chips comprises wire bonding connection and flip chip connection. In wire bonding connection, a wire bonder is disposed above the chip and then the tip of the conductive wire is melting to shape into a ball. Next, the conductive wire is bonded onto the bonding pad of the chip. Then, the wire bonder is moved and disposed above another bonding pad of the chip, and then another conductive wire will be bonded onto the corresponding bonding pad of the chip in the same way as mentioned above. In flip chip bonding, a plurality of bumps are formed on the bonding pads of the chip, and then flipped and bonded to another chip by a reflow process.

Next, a well-known wire bonding method utilized in a conventional MCM assembly package will be disclosed as below. As shown in FIG. 1, it illustrates the cross-sectional view of the conventional MCM package with wire bonding connection. The MCM package comprises a carrier 10, a first chip 12, a second chip 14, a plurality of conductive wires 160, 162 and 164, an encapsulation 18 and a plurality of solder balls 107. The carrier 10, for example a substrate and a lead frame, has an upper surface 102 and an opposite lower surface 104, a plurality of contacts 106, a first die paddle 105 and a second die paddle 109. The contacts 106, the first die paddle 105 and the second die paddle 109 are formed on the upper surface 102, and the first die paddle 105 and the second paddle 109 are encompassed with the contacts 106. As mentioned above, the first chip 12 has a first active surface 122, a first back surface 124 and a plurality of first bonding pads 126 formed on the first active surface 122. It is should be noted that the first chip 12 is mounted onto the first die paddle 105 of the carrier 10 via an adhesive 105 and electrically connected to the carrier 10 via the conductive wire 160. Therein one end of the conductive wire 160 is bonded to the bonding pad 126 and the other end of the conductive wire 160 is bonded onto the contact 106 of the carrier 10.

Similarly, the second chip 14 is mounted onto the second die paddle 109 of the carrier 10 via an adhesive (not shown) and electrically connected to the carrier 10 via the conductive wire 162. Therein one end of the conductive wire 162 is bonded to the bonding pad 146 and the other end of the conductive wire 162 is bonded onto the contact 108 of the carrier 10. In addition, the first chip 12 is electrically connected to the second chip 14 through the conductive wire 164. Furthermore, an encapsulation 18 encapsulates the first chip 12, the second chip 14 and the upper surface 102 of the carrier 10 and said conductive wires 160, 162 and 164.

In the above-mentioned MCM package, the first chip 12 is electrically connected to the second chip 14 through the conductive wire 164. However, the cross-sectional area of the conductive wire 164 is small and the length of the conductive wire 164 is long so as to cause the characterization impedance to be mismatched and to cause the signal to be attenuated. Besides, when the high-frequency circuits are performed, the parasitics of the inductance and the capacitor will be induced to cause the signal to be reflected. In addition, the cross-sectional area of the conductive wire for connecting the first chip is so small that the grounding connection will become worse.

Therefore, providing another MCM package to solve the mentioned-above disadvantages is the most important task in this invention.

SUMMARY OF THE INVENTION

In view of the above-mentioned problems, an objective of this invention is to provide an MCM package with bridge connection, which can shorten the distance of the electrical connection between the chips so as to upgrade the electrical performance of the MCM package.

To achieve the above-mentioned objective, an MCM package with bridge connection is provided, wherein the MCM package comprises a carrier, a first chip, a second chip, a conductive body and a plurality of solder balls. The carrier has an upper surface, an opposite lower surface and a plurality of contacts on the upper surface of the carrier. Moreover the first chip has a first active surface and a plurality of first bonding pads formed on the first active surface. Similarly, the second chip has a second active surface and a plurality of second bonding pads formed on the second active surface. Therein, the first chip and the second chip are both electrically connected to the carrier and disposed on the upper surface of the carrier. Besides, the first chip and the second chip is disposed in close proximity or directly connected with each other, and the first active surface is substantially coplanar to the second active surface. Most important, said MCM package is characterized in that there is a conductive body, e.g. tin-lead alloy, lead-free alloy and conductive epoxy, disposed on the first active surface and the second active surface continuously so as to electrically connect one of the first bonding pads and one of the second bonding pads. Therein, the first bonding pads are disposed on the edge of the fist active surface of the first chip and the second bonding pads are disposed on the edge of the second active surface of the second chip. In such a manner, the first bonding pads and the second bonding pads are disposed in proximity to each other.

As specified above, the MCM package further comprises an encapsulation for encapsulating the first chip, the second chip, the upper surface of the carrier and the conductive body.

According to this invention, the electrical connection between the chips is a conductive body. Thus, the distance of the electrical connection between the chips is short and the cross-sectional area for transmitting signal is large so as to lower the characterization impedance to prevent the signal from being attenuated. Furthermore, this invention can prevent the parasitics of the inductance and the capacitor from being induced so as to be suitable to the assembly package designed for performing high-circuits.

BRIEF DESCRIPTION OF THE DRAWINGS

The invention will become more fully understood from the detailed description given herein below illustrations only, and thus are not limitative of the present invention, and wherein.

DETAILED DESCRIPTION OF THE INVENTION

The MCM package with bridge connection according to the preferred embodiment of this invention will be described herein below with reference to the accompanying drawings, wherein the same reference numbers refer to the same elements.

Figure 1:
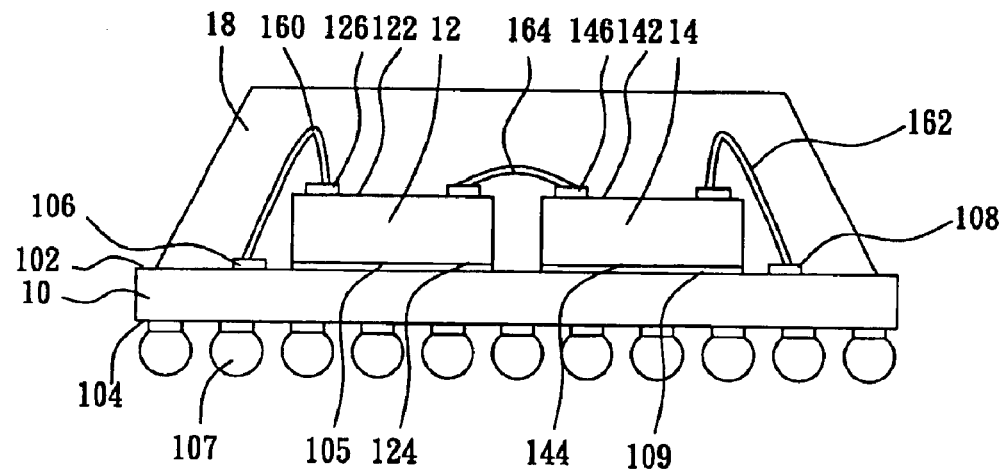
FIG. 1 is a cross-sectional view of the conventional MCM package.
Figure 2:
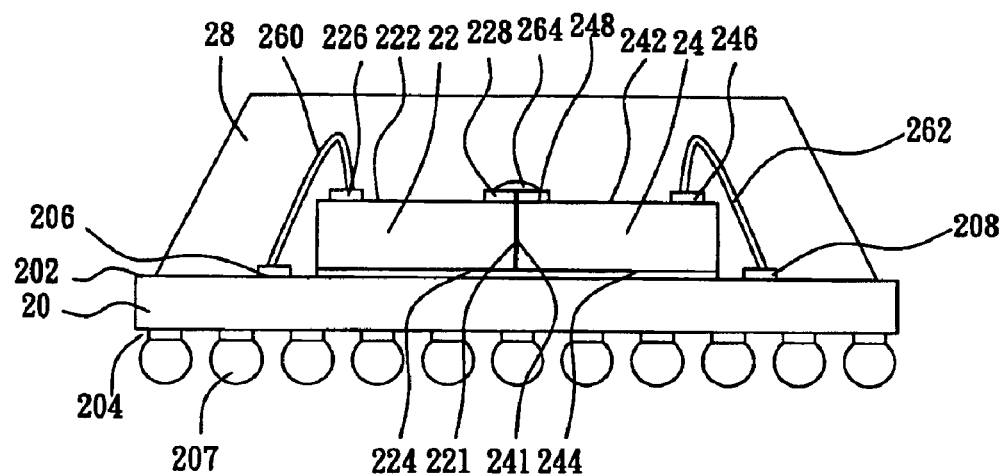
FIG. 2 is a cross-sectional view of an MCM package with bridge connection according to the first embodiment of the present invention.

In accordance with a first preferred embodiment as shown in FIG. 2, there is provided an MCM package. The MCM package mainly comprises a carrier 20, a first chip 22, a second chip 24, and a conductive body 264. The carrier 20 has an upper surface 202, an opposite lower surface 204, a plurality of contacts 206 and 208 formed on the upper surface 202 of the carrier 20. The first chip 22 has a first active surface 222 and at least one first bonding pad 226 formed on the active surface 222 of the first chip 22. Similarly, the second chip 24 has a second active surface 242 and at least one second bonding pad 246 formed on the second surface 242 of the second chip 24. Therein, the first chip 22 and the second chip 24 are both mounted on the carrier 20 through an adhesive. Besides, the conductive wire 260 electrically connects the first bonding pad 226 of the first chip 22 and the contact 206 of the carrier 20, and the conductive wire 262 electrically connects the second bonding pad 246 of the second chip 24 and the contact 208 of the carrier 20.

In addition, the first side surface 221 of the first chip 22 is in close proximity to the second side surface 241 of the second chip 24, and the first active surface 222 of the first chip 22 is coplanar to the second surface 242 of the second chip 24. Moreover, the first bonding pad 226 and the second bonding pad are respectively disposed on the edge of the first active surface 222 of the first chip 22 and the edge of the second active surface 242 of the second chip 24. The first conductive body 264, e.g. tin-lead alloy, lead-free alloy and conductive epoxy, is disposed on the first active surface 222 of the first chip 22 and the second active surface 242 of the second chip 24 continuously so as to electrically connect the first bonding pad 228 of the first chip 22 and the second bonding pad 248 of the second chip 24. As shown above, the MCM package further comprises an encapsulation 28 for encapsulating the first chip 22, the second chip 24, the upper surface 202 of the carrier 20 and the conductive body 264.

Figure 3:
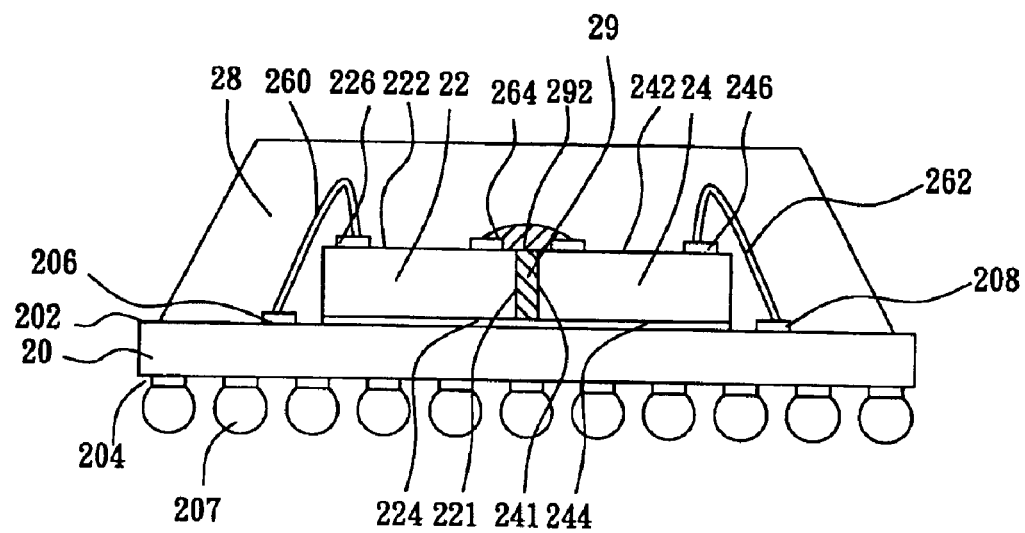
FIG. 3 is a cross-sectional view of an MCM package with bridge connection according to the second embodiment of the present invention.

Referring to FIG. 3, a second preferred embodiment is disclosed. There is a gap between the first side surface 221 of the first chip 22 and the second side surface 241 of the second chip 24 and a filler 29, e.g. non-conductive epoxy, is filled into the gap. The upper surface 292 of the filler 29 is coplanar to the first active surface 222 of the first chip 22 and the second active surface 242 of the second chip 24. Next, a screen-printing method is performed so as to form a solder material above the first bonding pad 226, the second bonding pad 246 and the upper surface 292 of the filler 29, wherein the solder material at least comprises flux and metal powder (not shown). Then a reflow process is performed so that the metal powder is melted to form a conductive body 264 for electrically and physically connecting the first bonding pad 226 and the second bonding pad 246. Therein, the conductive body can also be solder alloy, lead-free alloy or other conductive material without lead as provided in the first embodiment.

Figure 4:
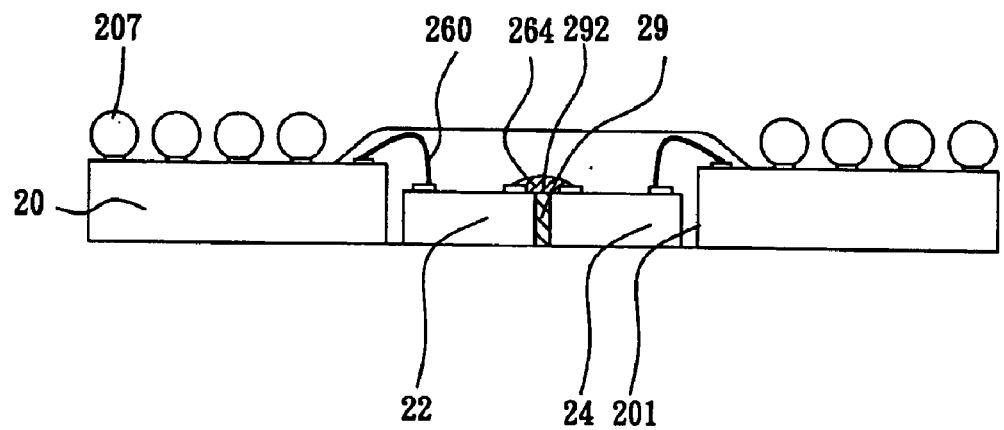
FIG. 4 is a cross-sectional view of an MCM package with bridge connection according to the third embodiment of the present invention.

Next, referring to FIG. 4, a third preferred embodiment is disclosed. In this embodiment, there is an opening 201 formed in the carrier 20, and passing through the upper surface 202 of the carrier 20 and lower surface 204 of the carrier 20. The first chip 22 and the second chip 24 are disposed in the opening 201, and the encapsulation 28 covers a portion of the upper surface 202 of the carrier 20, the first chip 22, the second chip 24 and the conductive body 264 so that the first back surface 224 of the first chip 22 and the second back surface 244 of the second chip 24 are exposed. Thereby, the thickness of the package will be reduced.

Figure 5:
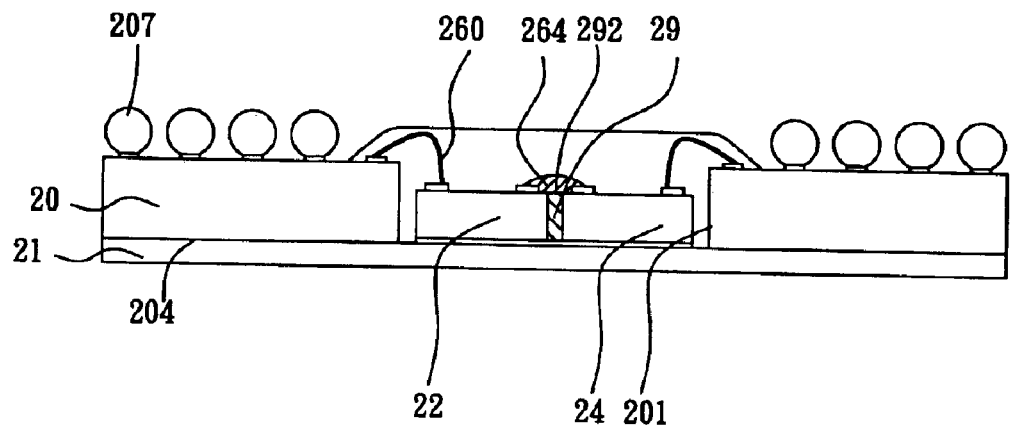
FIG. 5 is a cross-sectional view of an MCM package with bridge connection according to the fourth embodiment of the present invention.

Moreover, as mentioned above and referring to FIG. 5, a fourth preferred embodiment is disclosed. In this MCM package of said fourth embodiment, a heat spreader 21 is disposed below the carrier 20 and attached to the lower surface 204 of the carrier 20. Accordingly, the first chip 22 and the second chip 24 are disposed on the heat spreader 21 so as to upgrade the capability and performance for heat dissipation.

Figure 6:
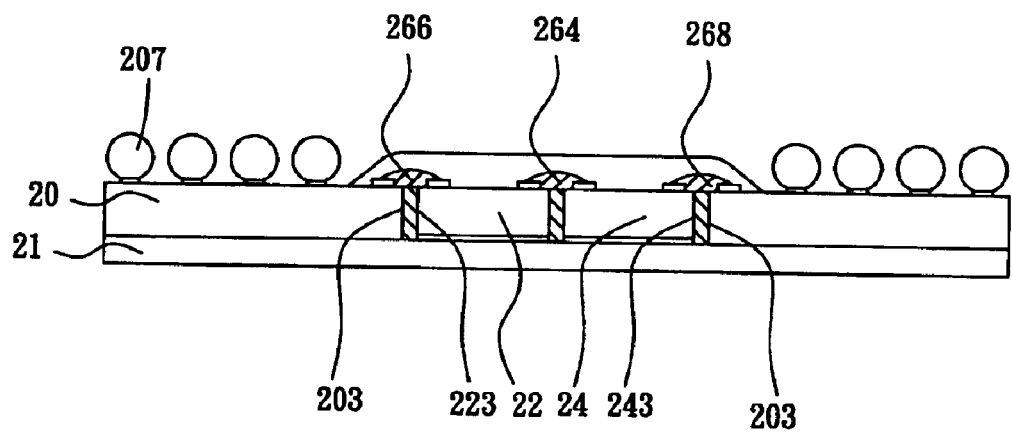
FIG. 6 is a cross-sectional view of an MCM package with bridge connection according to the fifth embodiment of the present invention.

It is should be noted that FIG. 6 shows a fifth preferred embodiment. The carrier 20 also has an opening 201 formed therein and the first chip 22 and the second chip 24 are disposed in the opening 201 continuously, and the size of the opening 201 is substantially the same as the size of the first chip 22 and the second chip 24 so that the third side surface 223 of the first chip 22, the fourth side surface 224 of the second chip 24 are directly contacted to the inner wall 203 of the opening 20. Moreover, the first active surface 222 of the first chip 22, the second active surface 242 of the second chip 24 and the upper surface 202 of the carrier 20 are coplanar to each other. Next, a second conductive body 266 is formed to electrically connect the first chip 22 and the carrier 20. Correspondingly, a third conductive body 268 is formed to electrically connect the second chip 24 and the carrier 20. However, similar to the first embodiment, the first conductive body 264 is formed on the first active surface 222 of the chip 22 and the second active surface 242 of the second chip 24 so as to electrically connect the first chip 22 and the second chip 24.

No matter which assembly process is performed to form such embodiments as shown above, a plurality of solder balls 207 can be implemented on the upper surface 202 of the carrier 20 or the lower surface 204 of the carrier 20 for electrically connecting to the outside or another external circuits.

In the aforementioned embodiments, the bonding pads of the chips can be electrically connected with each other through the conductive body, so the distance of the electrical connection between the bonding pads of the chips and between the bonding pad and the contact of the carrier are short, and the cross-sectional area for transmitting signal are large. Thus the transmission impedance can be reduced to prevent the signal from being attenuated. Furthermore, this invention can prevent the parasitics of the inductance and the capacitor from being induced so as to be suitable to the assembly package designed for performing high-circuits. Besides, the contacting areas between the conductive body and the contact of the carrier, and the contacting areas between the conductive body and the bonding pad of the chip are large, and the conductive body is directly contacted to the bonding pad of the chip so as to prevent the characterization impedance of the conductive body from being mismatched with corresponding contacts or bonding pads. In addition, this invention can improve the electrical performance of the MCM package so that the grounding connection will become better.

Figure 7:
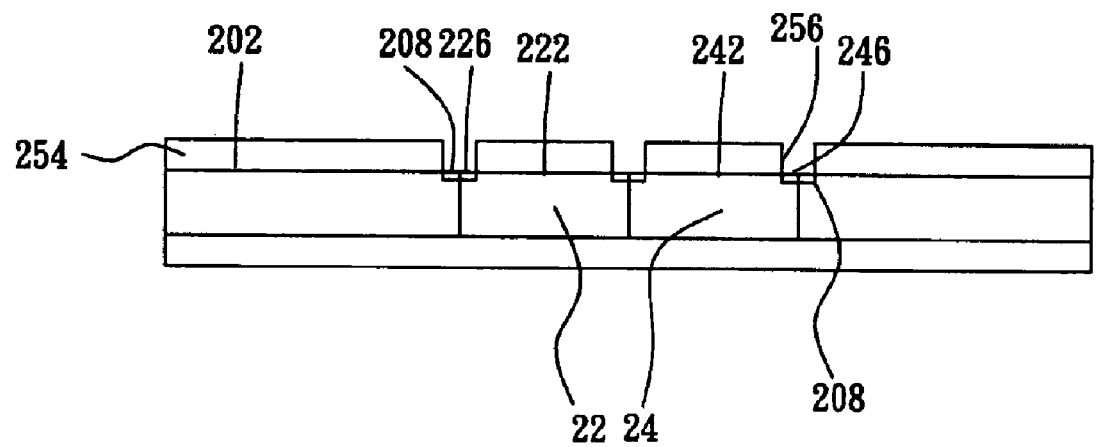
FIG. 7 to FIG. 9 are cross-sectional views illustrating the process flow of a fabrication method of the MCM package with bridge connection of FIG. 4.
Figure 8:
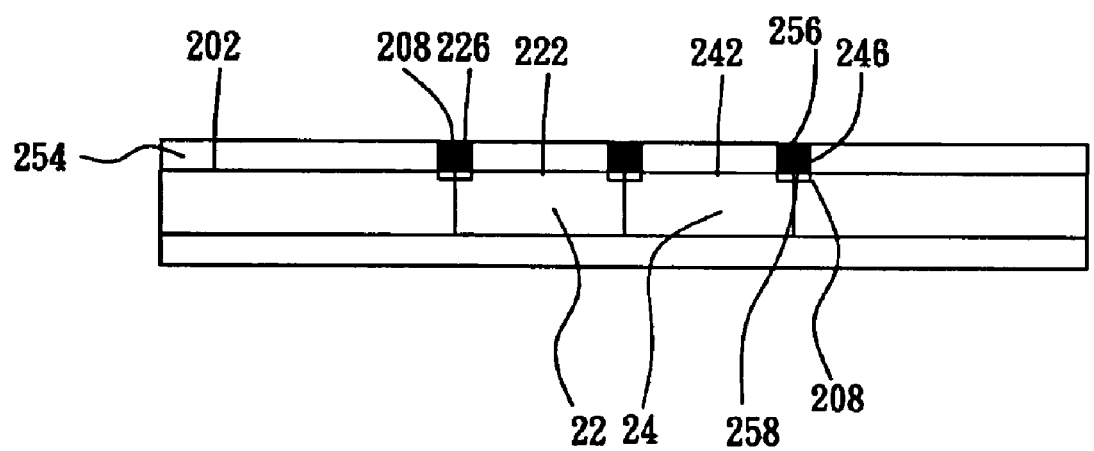
Figure 9:
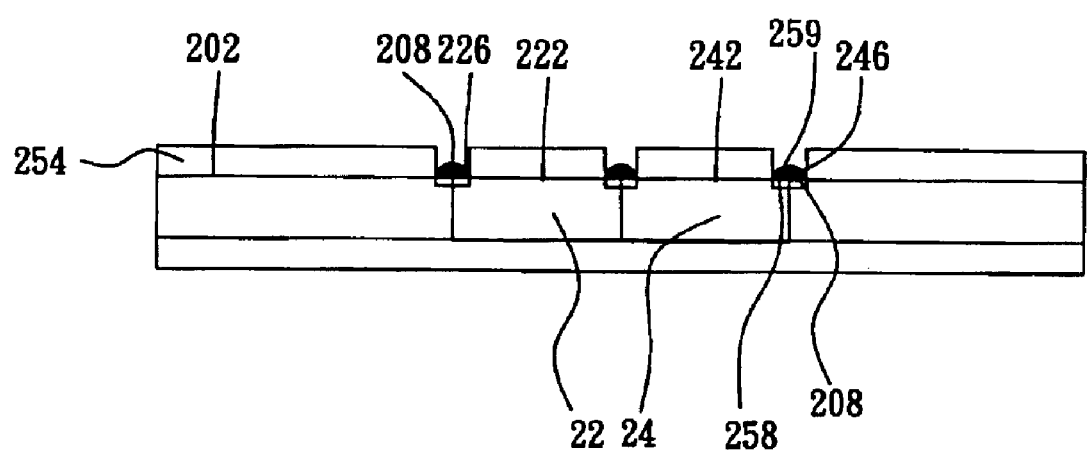

As mentioned above, the solder material is formed on the contacts or bonding pads by the method of screen-printing. However, the solder material is formed not only by said screen-printing method but also by the method as following shown. Referring to FIG. 7 to 9, a mask layer 254 is formed on the first active surface 222 of the first chip 22, the second active surface 242 of the second chip 24, and the upper surface 202 of the carrier 20. When the mask layer 254 is a photosensitive material, the openings 256 can be formed by performing exposure process so as to expose the first bonding pad 226, the second bonding pad 246 and the contact 208 of the carrier 20 through the openings 256. When the mask layer 254 is a non-photosensitive material, the openings 256 can be formed by performing development and etching process so as to expose the second bonding pad 246, the second bonding pad 246 and the contact 208 of the carrier 20 through the openings 256. Next, a solder material 258 can be filled into the opening 256 defined by the mask layer 254 as shown in FIG. 8. Therein, the solder material comprises flux (not shown) and metal powder, wherein the metal powder is mixed up with metal powder equally. Then a reflow process is performed so as to make the metal powder melted and solidified. Thus a conductive body 259 is formed on the first bonding pad 226, the second bonding pad 246 and the carrier contact 208 as shown in FIG. 9, wherein the first bonding pad 226 is electrically connected to the second bonding pad 246 via the conductive body 259. Afterwards, the mask layer 254 is removed and the following processes are performed as specified in the first embodiment. It should be noted that the reference numeral of each element shown in FIGS. 4, 5, 6, 7, 8 and 9 is corresponding the same reference one provided in FIG. 3.

Although the invention has been described in considerable detail with reference to certain preferred embodiments, it will be appreciated and understood that various changes and modifications may be made without departing from the spirit and scope of the invention as defined in the appended claims.

What is claimed is:

1. An MCM package with bridge connection, comprising:
   a carrier having an upper surface and a lower surface opposed to the upper surface;
   a first chip having a first active surface, a first back surface, a first side surface connecting the first active surface and the first back surface, and a first bonding pad formed on the first active surface and electrically connected to the carrier;
   a second chip having a second active surface, a second back surface, a second side surface connecting the second active surface and the second back surface, and a second bonding pad formed on the second active surface, and electrically connected to the carrier, wherein the first bonding pad is adjacent to the second bonding pad; and
   a first conductive body disposed continuously on the first active surface and the second active surfacer and electrically connecting the first chip and the second chip.

2. The MCM package of claim 1, further comprising an encapsulation covering the first chip, the second chip, the upper surface of the carrier and the first conductive body.

3. The MCM package of claim 1, wherein the first back surface is attached on the upper surface of the carrier and the second back surface is attached on the upper surface of the carrier.

4. The MCM package of claim 1, further comprising a plurality of solder balls disposed on the lower surface of the carrier.

5. The MCM package of claim 1, wherein the first bonding pad is disposed at an edge of the first active surface of the first chip.

6. The MCM package of claim 1, wherein the second bonding pad is disposed at an edge of the second active surface of the second chip.

7. The MCM package of claim 1, wherein the first conductive body is made of a material selected from the group consisting of tin-lead alloy, lead-free alloy and conductive epoxy.

8. The MCM package of claim 1, wherein the first side surface is adjacent to the second side surface.

9. The MCM package of claim 1, wherein the first active surface is coplanar to the second active surface.

10. The MCM package of claim 1, further comprising a plurality of first conductive wires electrically connecting the first chip and the carrier.

11. The MCM package of claim 1, further comprising a plurality of second conductive wires electrically connecting the second chip and the carrier.

12. The MCM package of claim 9, wherein a filler is disposed between the first side surface and the second side surface and the filler has a top surface coplanar to the first active surface and the second active surface.

13. The MCM package of claim 1, wherein the carrier further comprises an opening, and the first chip and the second chip are disposed in the opening.

14. The MCM package of claim 13, further comprising a heat spreader disposed on the lower surface of the carrier.

15. The MCM package of claim 14, further comprising a plurality of solder balls disposed on the upper surface of the carrier.

16. The MCM package of claim 13, wherein the opening has an inner wall, the first chip and the second chip has a third side surface and a forth side surface respectively, and the inner wall is proximate to the third side surface and the fourth side surface.

17. The MCM package of claim 16, wherein the first active surface, the second active surface and the carrier are coplanar with each other.

18. The MCM package of claim 16, further comprising a heat spreader disposed on the lower surface of the carrier.

19. The MCM package of claim 17, further comprising a heat spreader disposed on the lower surface of the carrier.

20. The MCM package of claim 18, further comprising a plurality of solder balls disposed on the upper surface of the carrier.

21. The MCM package of claim 19, further comprising a plurality of solder balls disposed on the upper surface of the carrier.

22. The MCM package of claim 13, further comprising a plurality of first conductive wires electrically connecting the first chip and the carrier.

23. The MCM package of claim 13, further comprising a plurality of second conductive wires electrically connecting the second chip and the carrier.

24. The MCM package of claim 16, further comprising a second conductive body connecting the first chip and the carrier.

25. The MCM package of claim 16, further comprising a second conductive body connecting the second chip and the carrier.

26. The MCM package of claim 17, further comprising a second conductive body connecting the first chip and the carrier.

27. The MCM package of claim 17, further comprising a second conductive body connecting the second chip and the carrier.

28. An MCM package with bridge connection, comprising:

a carrier having an upper surface and a lower surface opposed to the upper surface;

a first chip having a first active surface, a first back surface, a first side surface connecting the first active surface and the first back surface, and a first bonding pad formed on the first active surface and electrically connected to the carrier;

a second chip having a second active surface, a second back surface, a second side surface connecting the second active surface and the second back surface, and a second bonding pad formed on the second active surface, and electrically connected to the carrier, wherein the first side surface is adjacent to the second side surface; and a first conductive body disposed continuously on the first active surface and the second active surface, and electrically connecting the first chip and the second chip.

* * * * *